United States Patent [19]
Bray et al.

[11] Patent Number: 4,931,752
[45] Date of Patent: Jun. 5, 1990

[54] POLYIMIDE DAMPER FOR SURFACE ACOUSTIC WAVE DEVICE

[75] Inventors: Robert C. Bray; Catherine A. Johnsen, both of Santa Rosa; Timothy L. Bagwell, Rohnert Park; Waguih S. Ishak, Cupertino, all of Calif.

[73] Assignee: Hewlett-Packard Company, Palo Alto, Calif.

[21] Appl. No.: 103,559

[22] Filed: Sep. 30, 1987

[51] Int. Cl.⁵ .................. H03H 9/09; B05D 3/06
[52] U.S. Cl. .................. 333/151; 333/194; 333/195; 310/313 R; 310/313 D; 427/10; 29/25.35
[58] Field of Search .............. 333/151, 191, 193, 194, 333/195; 29/25.35; 310/313 R, 313 A, 313 B, 313 C, 313 D; 427/10, 100

[56] References Cited

U.S. PATENT DOCUMENTS

| 4,354,129 | 10/1982 | Ieki | 310/313 C |
| 4,435,441 | 3/1984 | Mariani et al. | 427/100 X |
| 4,516,095 | 5/1985 | Lee | 333/194 |
| 4,598,261 | 7/1986 | Ballato | 333/196 X |
| 4,642,507 | 2/1987 | Suthers et al. | 310/313 B |
| 4,761,298 | 8/1988 | Vig | 427/10 |

FOREIGN PATENT DOCUMENTS

| 86301324.9 | 2/1986 | European Pat. Off. | |
| 0109018 | 8/1980 | Japan | 333/150 |
| 0150212 | 9/1982 | Japan | 333/194 |
| 0180318 | 9/1985 | Japan | |

Primary Examiner—Eugene R. LaRoche
Assistant Examiner—Seung Ham
Attorney, Agent, or Firm—William C. Milks, III

[57] ABSTRACT

A surface acoustic wave (SAW) device is provided which includes a piezoelectric substrate, an input transducer formed on the substrate for launching acoustic surface waves along a propagation path on the substrate, an output transducer formed on the substrate across the propagation path from the input transducer for receiving acoustic surface waves generated by the input transducer, and at least one area of acoustic energy absorbing material, preferably polyimide, formed on the substrate between the edge of the substrate and a corresponding transducer. The acoustic absorber is patterned on the SAW device substrate while the device is still in wafer form using photolithographic processing techniques.

31 Claims, 2 Drawing Sheets

4,931,752

POLYIMIDE DAMPER FOR SURFACE ACOUSTIC WAVE DEVICE

BACKGROUND OF THE INVENTION

1. Field of the Invention

The present invention relates to surface acoustic wave (SAW) devices and, in particular, to the use of polyimide absorbent layers patterned on the surface of a SAW device for the purpose of damping spurious signals.

2. Discussion of the Prior Art

Surface acoustic wave (SAW) devices of the type that utilize a piezoelectric substrate for propagating surface waves between a transmitting transducer and a receiving transducer are well known. Typically, the interdigital transducers, or IDTs, are formed as arrays of interleaved aluminum electrodes deposited on the surface of the substrate. In response to electrical input signals, the transmitting transducer launches corresponding acoustic surface waves along a predetermined path on the surface of the substrate. The receiving transducer detects the acoustic waves and generates corresponding electrical output signals.

In SAW devices of the type described above, the transmitting transducer launches surface waves in opposite directions simultaneously. Similarly, the receiving transducer receives surface waves from either direction. This results in a significant problem in most SAW devices because, in addition to the receiving transducer responding to surface waves travelling directly from the transmitting transducer to the receiving transducer, both transducers respond to spurious surface waves which have been reflected from the edges of the substrate. These reflected surface waves produce unwanted signals that distort the main, desired signal, adversely affecting the performance of the SAW device.

Various methods have been proposed for suppressing edge-reflected surface waves. The most common approach is to apply an acoustic absorber on the substrate surface between the edge of the substrate and the back edge of the adjacent transducer. The geometry of the absorber is chosen so as to be sufficient to absorb the unwanted surface waves launched toward the edges of the substrate and reflected back to the IDTs from the edges. Commonly-used absorbent materials include RTV (room-temperature vulcanizing silicone rubber), black wax and epoxy resin.

An example of the use of an acoustic absorbent material for suppressing spurious surface waves is disclosed in U.S. Pat. No. 4,354,129 titled "Absorber For Piezoelectric Surface Acoustic Wave Device", issued to Ieki on Oct. 12, 1982. Ieki teaches a SAW device which includes a lead-zirconium-titanate (PZT) substrate, transmitting and receiving transducers mounted on the surface of the substrate for propagating acoustic waves between the transducers, and epoxy resin acoustic absorbers formed on the substrate between the end of the substrate and an adjacent transducer for absorbing unwanted acoustic waves. The shape of Ieki's absorber is related to the energy distribution of the acoustic waves. The epoxy absorbers disclosed by Ieki are deposited on the SAW device substrate by conventional techniques such as screen printing.

A second example of the use of acoustic absorbent materials on SAW devices is provided by U.S. Pat. No. 4,516,095 titled "Surface Acoustic Wave Device", issued to Lee on May 7, 1985. Lee teaches a SAW device having acoustic absorbers positioned both at the edges of the substrate as well as between the transmitting transducer and the receiving transducer. The acoustic absorber located between the transducers increases the insertion loss of the device and, consequently, suppresses "triple transit signals" which result from the interaction between the input and output transducers. Lee discloses that the absorbent material used both between the transducers and at the edges of the substrate may be chosen from among silicone rubber, epoxy resin, a mixture of silicone rubber and epoxy resin, each of the foregoing mixed with an oxide powder, and wax. According to Lee, the acoustic absorbent material is applied to the SAW device substrate by conventional screen printing techniques.

The above-described approach to suppressing spurious edge-reflected acoustic waves suffers from a number of major disadvantages. First, the techniques used for applying the absorbent material, i.e. either painting or screen printing, are either extremely labor intensive or very expensive, involving either manual or robotic application of the absorbent material to individual SAW devices. Second, both the type of absorbent material used and the technique for applying it require high dimensional tolerances to avoid interference with the adjacent transducers; this results in unnecessarily large SAW devices. Third, since the absorbent material is applied by relatively crude techniques, the volume of material applied and its resulting geometry is poorly controlled, often resulting in undesired wave reflection from the absorbent material itself. Fourth, all of the commonly-used absorbent materials are unstable at higher temperatures, limiting both subsequent processing techniques for fabricating SAW devices as well as the applications in which the completed SAW devices can be utilized.

U.S Pat. No. 4,642,507 titled "SAW Devices With Reflection-Suppressing Fingers", issued to Suthers et al on Feb. 10, 1987 and European patent Application No. 86301324.9 titled "SAW devices including resistive films", filed by Oliver et al and published on Oct. 12, 1986 disclose the utilization of a silicon film acoustic wave absorber in conjunction with a SAW device. However, for this application, silicon absorbers can only be successfully applied to substrates having high piezoelectric coupling.

It would, therefore, be highly desirable to have available a simple, inexpensive technique for the precision application of a temperature-resistent, acoustic wave absorber material to a wide range of SAW device substrates for the purpose of damping spurious signals.

SUMMARY OF THE INVENTION

Accordingly, the present invention provides a technique for applying acoustic wave absorber material to SAW devices while the devices are still in wafer form, rather than applying it to individual devices. This eliminates the need for time-consuming manual or costly robotic application techniques.

The present invention also provides a technique for precision placement of the absorber material on a SAW device using photolithography, resulting in optimal use of substrate area.

Also, the present invention provides a technique for applying an acoustic absorber material which permits intricate patterning of the absorber material to minimize reflections and, therefore, optimize the frequency response of the SAW device.

The preferred absorber material, i.e. polyimide, is stable at high temperatures, thus expanding both the processing techniques which may be utilized in fabricating SAW devices and the applications in which SAW devices can be used.

In particular, a preferred embodiment of the present invention provides a surface acoustic wave (SAW) device which comprises a lithium niobate substrate, an aluminum input transducer formed on the substrate for launching acoustic surface waves along a propagation path in the substrate, an aluminum output transducer formed on the substrate across the propagation path from the input transducer for receiving acoustic waves generated by the input transducer, and areas of acoustic wave absorbing polyimide material formed between the edge of the substrate and a corresponding transducer.

The polyimide acoustical absorbers are patterned on the substrate while the SAW devices are still in wafer form using state-of-the-art photolithographic techniques. In contrast to SAW devices fabricated according to conventional techniques, the resulting SAW device is stable at temperatures up to 500° C.

Other objects, features and advantages of the present invention will become apparent and be appreciated by reference to the detailed description of a preferred embodiment of the invention provided below which should be considered in conjunction with the accompanying drawings.

DETAILED DESCRIPTION OF THE INVENTION

Figure 1:
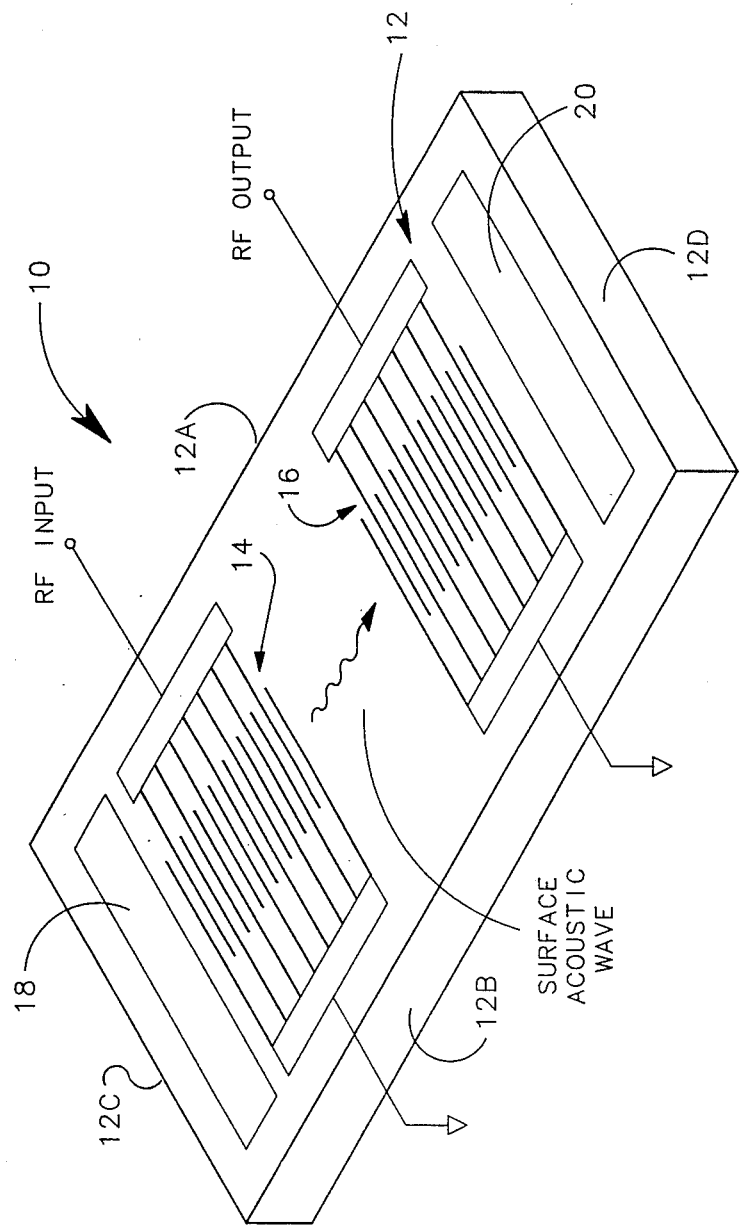
FIG. 1 is a perspective view illustrating an embodiment of a surface acoustic wave (SAW) device fabricated in accordance with the present invention.

FIG. 1 shows a surface acoustic wave (SAW) device 10 which includes piezoelectric means 12. The piezoelectric means 12 can comprise a monolithic substrate consisting of suitable acoustic surface wave propagating material, for example, lithium niobate or quartz, or can alternatively comprise a composite structure consisting of piezoelectric material, such as zinc oxide, deposited on discrete areas of an acoustic surface wave propagating material such as sapphire or glass (silica). The piezoelectric coupling constants ($k^2$) for the various acoustic surface wave propagating materials range from 0.05 for lithium niobate to zero for sapphire and glass, the piezoelectric coupling constant for quartz being 0.0014. See Oliner, A. A., Ed., *Acoustic Surface Waves*, New York: Springer-Verlag, 1978, p. 300.

The piezoelectric substrate or structure 12 has side edges 12A and 12B and end edges 12C and 12D. An input or transmitting transducer 14 of suitable conductive material, for example aluminum, is deposited on the surface of the substrate, or on piezoelectric material deposited on discrete areas of the structure, according to well-known methods such as, for example, by evaporation or sputtering. Transducer 14 launches acoustic surface waves along a propagation path on the piezoelectric substrate or structure 12 in response to an electrical input signal. An output or receiving transducer 16 of a material similar to that of the input transducer 14 is similarly deposited on the piezoelectric substrate or structure 12 across the propagation path from the input transducer 14 to receive acoustic surface waves generated by the input transducer 14. Transducer 16 is connected to provide electrical output signals corresponding to the received acoustic waves.

For convenience and clarity in this specification, the edge of each transducer 14 or 16 which is nearer to the other transducer is referred to as the front edge of the transducer, and the edge of each transducer which is farther from the other transducer, and hence is closer to an end edge 12C or 12D of the piezoelectric substrate or structure 12, is referred to as the back edge of the transducer.

As shown in FIG. 1, in accordance with the present invention, areas of surface acoustic wave absorbing material 18 and 20 are preferably formed on the surface of the piezoelectric substrate or structure 12 between the end edges 12C and 12D and the back edges of the adjacent transmitting and receiving transducers 14 and 16, respectively, for the purpose of absorbing extraneous surface acoustic waves and minimizing their reflection back toward the transducers. The sound absorbent material can have a sound attenuation constant greater than 30 dB per centimeter at 300 megahertz and is stable and without gaseous discharge at temperatures above 180 degrees Centigrade. In accordance with one embodiment of the invention, the sound absorbent material is polyimide applied to piezoelectric means having a coupling constant less than 0.002.

The polyimide absorbers 18, 20 are applied and patterned using conventional semiconductor photolithographic processing techniques. As described in greater detail below, the pattern and position of the polyimide absorbers 18, 20 may be different for different shapes and sizes of surface acoustic wave devices.

The process disclosed hereinbelow for forming the polyimide absorbers 18, 20 on the surface of the piezoelectric substrate or structure 12 of SAW device 10 is based on application of a polyimide precursor in accordance with the manufacturer's directions. In the embodiment described below, the polyimide precursor is commercially-available DuPont PI2525.

To apply the PI2525 polyimide precursor to the SAW device, a lithium niobate wafer comprising a number of SAW devices is first solvent cleaned. The wafer is then placed on a spinner and secured by means of a conventional vacuum chuck. The wafer is then flooded with a suitable adhesion promoter, in this case DuPont VM-651. Following flooding with the adhesion promoter, and after a 20 second pause, the wafer is spun at 4000 RPM for 30±1 seconds. This adhesion promoter step is then repeated.

Next, the wafer is flooded with the PI2525 polyimide precursor. A 250 watt heat lamp is then placed over the wafer at a distance of about 3 inches and turned on for 30 seconds. The wafer is then spun at 4000 RPM for 30±1 seconds with the heat lamp on. The vacuum chuck is then released and the wafer is removed from the spinner and placed flat (tilting or use of a vertical boat should be avoided) on a tray or in a container to await the bake cycle.

Next, the wafer is baked in a 95±2° C. oven for 30±1 minutes. The wafers must remain flat during the bake cycle or the polyimide will flow. At the end of the bake cycle, the wafers are cooled for at least 15 but not more than 60 minutes before processing is continued.

Next, a positive photoresist is spun on the wafer using a 6000 RPM spin speed and a 30±1 second spin time. The photoresist is baked at 80±2° C. for 30±1° minutes. The wafers must remain flat during the photoresist bake. At the end of the photoresist bake cycle, the wafers are allowed to cool for at least 15 but not more than 60 minutes before processing is continued.

The wafer is then aligned with a clear field mask and the photoresist is exposed for 25 seconds at 4.0 milliwatts/cm$^2$. The photoresist is developed with AZ developer mixed 1:1 with water, and which has been cooled to 21±1° C., until the photoresist and the polyimide under the exposed photoresist are dissolved away. Developing proceeds for 30±1 seconds, raising and lowering the wafer boat in the developer at 6 seconds, 12 seconds and 18 seconds.

The wafer is then rinsed for 2 minutes in flowing deionized water and inspected to ensure total removal of the polyimide in the unwanted areas. Unexposed photoresist is removed with acetone. The wafer is then rinsed with isopropyl alcohol and blown dry.

The polyimide is then cured at 300° C. for 15 minutes. This involves ramping the temperature up slowly so as not to cause thermal shock to the wafer. Similarly, the wafer must be cooled slowly.

Polyimide patterning by photolithographic techniques provides a substantial improvement in absorber pattern placement as well as in pattern size tolerances. Use of polyimide permits precision placement of the acoustic absorbers within ±0.5 microns accuracy as compared to screen printing or robotic placement with an accuracy of ±20 microns. Furthermore, the polyimide pattern size can be made accurate within ±1 microns in any dimension as compared to RTV or epoxy resin which have a patterning tolerance of about ±20 microns (the patterning characteristics of black wax are not suitable for any production SAW device.)

With respect to temperature sensitivity, polyimide can withstand temperatures up to 500° C. Normal RTV is unstable above 100° C., high temperature RTV can withstand up to 260° C. and epoxy resin is operable up to 100° C. Black wax will begin to melt at about 70° C. However, RTV outgases at all temperatures, which results in redeposition of corrosive material, thereby degrading performance.

Figure 2:
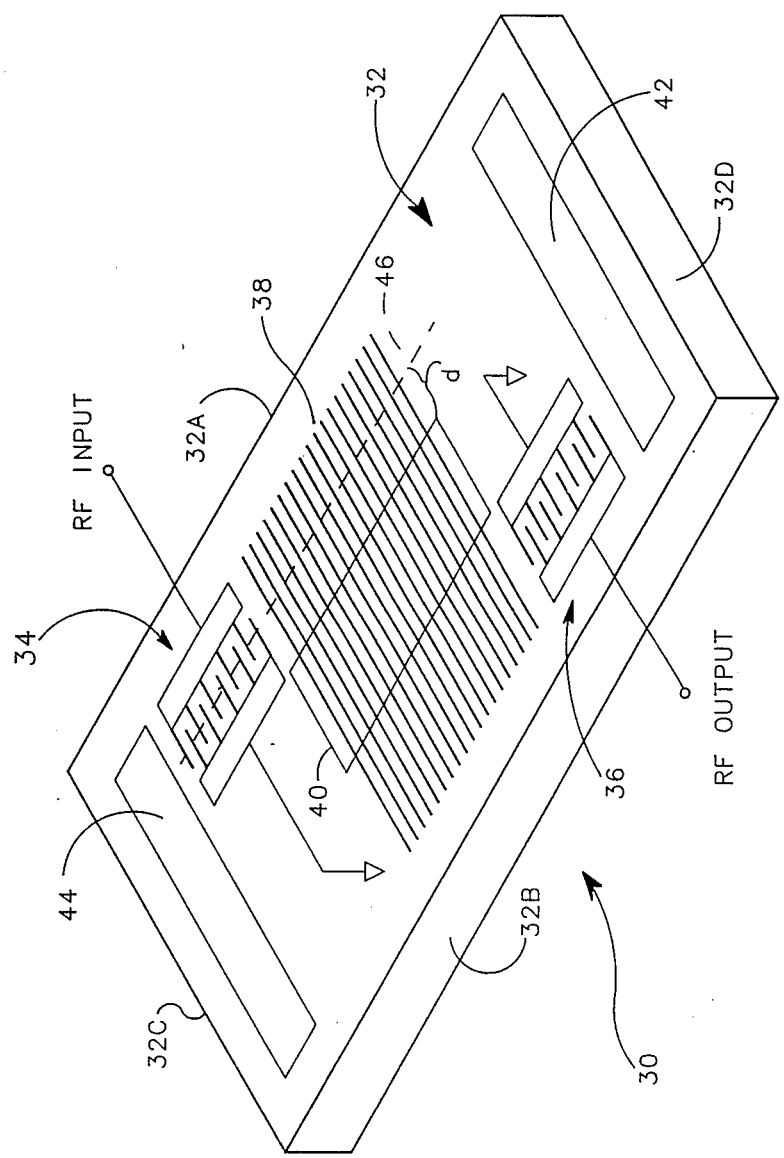
FIG. 2 is a perspective view illustrating an embodiment of a SAW device which employs a multistrip coupler and is fabricated in accordance with the present invention.

FIG. 2 illustrates the application of the polyimide absorber concepts described above to a SAW device 30 that employs a multistrip coupler. Input transducer 34 and output transducer 36 are formed on the surface of a piezoelectric substrate or structure 32 in the conventional manner so as to be both longitudinally and laterally spaced apart from one another. A series of multistrip couplers 38 of the same material as the transducers 34, 36 is formed in the longitudinal space between the transducers 34, 36 and extends continuously laterally to span the entire width of both transducers 34, 36. To this point, the description of SAW device 30 is consistent with the description of a conventional SAW device. The offset placement of the input and output transducers 34, 36 is for the purpose of shaping the frequency domain response of the device.

As shown in FIG. 2, in accordance with the present invention, the multistrip coupled SAE device 30 includes polyimide absorber strips 42 and 44 formed on the substrate 32 between the end edges 32C and 32D of the piezoelectric substrate or structure 32 and the adjacent transmitting and receiving transducers 34, 36, respectively. Additionally, a polyimide strip 40 is formed in the lateral space between the input transducer 34 and the output transducer 36.

As shown in FIG. 2, a line 46 bisects the front and rear edges of the transducer 34. The polyimide strip 40 is photolithographically applied to the piezoelectric substrate or structure 32 so that the edge of the strip parallel to the side edge 32A of the substrate or structure 32 is within a range of not greater than one (1) micron of a predetermined distance d from line 46.

It should be understood that various alternatives to the structures described herein may be employed in practicing the invention. It is intended that the following claims define the scope of the invention and that the structure and methods within the scope of these claims and their equivalents be covered thereby.

We claim:

1. A surface acoustic wave (SAW) device comprising:
    piezoelectric means having end and side edges;
    an input transducer in contact with the piezoelectric means for launching acoustic surface waves along a propagation path on the piezoelectric means in response to input electrical signals;
    an output transducer in contact with the piezoelectric means across the propagation path from the input transducer and responsive to surface waves generated by the input transducer for generating output electrical signals corresponding to the received surface waves; and
    an acoustic energy absorbing polyimide area formed on the surface of the piezoelectric means between the input transducer and an edge of the piezoelectric means adjacent the input transducer, the acoustic energy absorbing polyimide area having a sound attenuation constant greater than 30 dB per centimeter at 300 megahertz and stable and without gaseous discharge at temperatures about 180 degrees Centigrade.

2. The SAW device according to claim 1, further comprising a second acoustic energy absorbing polyimide area formed on the piezoelectric means between the output transducer and a second end edge of the piezoelectric means adjacent the output transducer.

3. The SAW device according to claim 2 wherein the substrate comprises lithium niobate.

4. The SAW device according to claim 2 wherein both the input transducer and the output transducer are formed of aluminum.

5. A multistrip coupled surface acoustic wave (SAW) device comprising:
    piezoelectric means having end and side edges;
    an input transducer in contact with the piezoelectric means for launching acoustic surface waves along a propagation path on the piezoelectric means in response to input electrical signals;
    an output transducer in contact with the piezoelectric means so as to be both longitudinally and laterally spaced apart from the input transducer;
    at least one coupling strip formed on the piezoelectric means in the longitudinal space between the input transducer and the output transducer; and
    a polyimide absorber strip formed on the piezoelectric means and the at least one coupling strip in the lateral space between the input transducer and the output transducer, the polyimide absorber strip having a sound attenuation constant greater than 30 dB per centimeter at 300 megahertz and stable and without gaseous discharge at temperatures above 180 degrees Centigrade.

6. The SAW device according to claim 5, and further comprising a first acoustic energy absorbing polyimide area formed on the piezoelectric means between the input transducer and an end edge of the piezoelectric means adjacent the input transducer.

7. The SAW device according to claim 6, further comprising a second acoustic energy absorbing polyimide area formed on the piezoelectric means between the output transducer and a second end edge of the piezoelectric means adjacent the output transducer.

8. A method of forming an area of acoustic wave absorber material on a surface acoustic wave (SAW) device, comprising the steps of:
(a) introducing a polyimide precursor having a sound attenuation constant greater than 30 dB per centimeter at 300 megahertz and stable and without gaseous discharge at temperatures above 180 degrees Centigrade to the surface of the device;
(b) patterning the polyimide precursor to a desired shape using photolithography; and
(c) curing the patterned polyimide precursor.

9. A method of simultaneously forming acoustic wave absorbers on a plurality of surface acoustic wave (SAW) devices in wafer form, the SAW devices being of the type wherein an input transducer is formed on the surface of piezoelectric means for launching acoustic surface waves along a propagation path on the piezoelectric means in response to input electrical signals and an output transducer is formed on the surface of the piezoelectric means across the propagation path from the input transducer and is responsive to surface waves generated by the input transducer for generating output signals corresponding to the received surface waves, the method comprising the sequential steps of:
(a) spinning an adhesion promoter on a surface of the wafer common to the transducers of the SAW devices comprising the wafer;
(b) flooding the wafer surface with a polyimide precursor;
(c) spinning the polyimide precursor on the surface of the wafer;
(d) baking the polyimide precursor at between about 93–97° C.;
(e) cooling the wafer to room temperature;
(f) spinning a positive photoresist on the surface of the wafer;
(g) baking the photoresist at between about 78–82° C.;
(h) exposing selected portions of the baked photoresist to define the polyimide acoustic wave absorbers;
(i) dissolving away the photoresist and polyimide except for the polyimide acoustic wave absorbers; and
(j) curing the polyimide acoustic wave absorbers.

10. An acoustic energy absorbing area for a surface acoustic wave (SAW) device including piezoelectric means having end and side edges, an input transducer in contact with the piezoelectric means for launching acoustic surface waves along a propagation path on the piezoelectric means in response to input electrical signals, and an output transducer in contact with the piezoelectric means across the propagation path from the input transducer and responsive to surface waves generated by the input transducer for generating output electrical signals corresponding to the received surface waves, the acoustic energy absorbing area consisting of polyimide formed on the surface of the piezoelectric means between at least one of the transducers and an end edge of the piezoelectric means adjacent the at least one transducer, the polyimide having a sound attenuation constant greater than 30 dB per centimeter at 300 megahertz and stable and without gaseous discharge at temperatures above 180 degrees Centigrade.

11. The SAW device according to claim 10, further comprising a second acoustic energy absorbing polyimide area formed on the piezoelectric means between the output transducer and a second end edge of the piezoelectric means adjacent the output transducer.

12. A surface acoustic wave (SAW) device comprising:
piezoelectric means having end and side edges, the piezoelectric means having a piezoelectric coupling constant less than 0.002;
an input transducer in contact with the piezoelectric means for launching acoustic surface waves along a propagation path on the piezoelectric means in response to input electrical signals;
an output transducer in contact with the piezoelectric means across the propagation path from the input transducer and responsive to surface waves generated by the input transducer for generating output electrical signals corresponding to the received surface waves; and
an acoustic energy absorbing area consisting of sound absorbent material having a sound attenuation constant greater than 30 dB per centimeter at 300 megahertz and stable and without gaseous discharge at temperatures above 180 degrees Centigrade formed on the surface of the piezoelectric means between the input transducer and an end edge of the piezoelectric means adjacent the input transducer.

13. The SAW device according to claim 12 wherein the sound absorbent material is polyimide.

14. The SAW device according to claim 12, further comprising a second acoustic energy absorbing area consisting of sound absorbent material having a sound attenuation constant greater than 30 dB per centimeter at 300 megahertz and stable and without gaseous discharge at temperatures above 180 degrees Centigrade formed on the surface of the piezoelectric means between the output transducer and a second end edge of the piezoelectric means adjacent the output transducer.

15. The SAW device according to claim 14 wherein the sound absorbent material is polyimide.

16. A multistrip coupler surface acoustic wave (SAW) device comprising:
piezoelectric means having end and side edges, the piezoelectric means having a piezoelectric coupling constant less than 0.002;
an input transducer in contact with the piezoelectric means for launching acoustic surface waves along a propagation path on the piezoelectric means in response to input electrical signals;
an output transducer in contact with the piezoelectric means so as to be both longitudinally and laterally spaced apart from the input transducer;
at least one coupling strip formed on the piezoelectric means in the longitudinal space between the input transducer and the output transducer; and
an absorber strip consisting of sound absorbent material having a sound attenuation constant greater than 30 dB per centimeter at 300 megahertz and stable and without gaseous discharge at temperatures above 180 degrees Centigrade formed on the surface of the piezoelectric means and the at least one coupling strip in the lateral space between the input transducer and the output transducer.

17. The SAW device according to claim 16 wherein the sound absorbent material is polyimide.

18. The SAW device according to claim 16, further comprising an acoustic energy absorbing area consisting of sound absorbent material having a sound attenuation constant greater than 30 dB per centimeter at 300 megahertz and stable and without gaseous discharge at temperatures above 180 degrees Centigrade formed on the surface of the piezoelectric means between the input transducer and an end edge of the piezoelectric means adjacent the input transducer.

19. The SAW device according to claim 18, further comprising a second acoustic energy absorbing area consisting of sound absorbent material having a sound attenuation constant greater than 30 dB per centimeter at 300 megahertz and stable and without gaseous discharge at temperatures above 180 degrees Centigrade formed on the surface of the piezoelectric means between the output transducer and a second end edge of the piezoelectric means adjacent the output transducer.

20. An acoustic energy absorbing area for a surface acoustic wave (SAW) device including piezoelectric means having end and side edges, the piezoelectric means having a piezoelectric coupling constant less than 0.002, an input transducer in contact with the piezoelectric means for launching acoustic surface waves along a propagation path on the piezoelectric means in response to input electrical signals, and an output transducer in contact with the piezoelectric means across the propagation path from the input transducer and responsive to surface waves generated by the input transducer for generating output electrical signals corresponding to the received surface waves, the acoustic energy absorbing area consisting of sound absorbent material having a sound attenuation constant greater than 30 dB per centimeter at 300 megahertz and stable and without gaseous discharge at temperatures above 180 degrees Centigrade formed on the surface of the piezoelectric means between at least one of the transducers and an end edge of the piezoelectric means adjacent the at least one transducer.

21. The SAW device according to claim 20 wherein the sound absorbent material is polyimide.

22. A surface acoustic wave (SAW) device comprising:
    piezoelectric means having end and side edges, the piezoelectric means having a piezoelectric coupling constant less than 0.002;
    an input transducer in contact with the piezoelectric means for launching acoustic surface waves along a propagation path on the piezoelectric means in response to input electrical signals, the input transducer having a back edge;
    an output transducer in contact with the piezoelectric means across the propagation path from the input transducer and responsive to surface waves generated by the input transducer for generating output electrical signals corresponding to the received surface waves; and
    an acoustic energy absorbing area consisting of sound absorbent material having a sound attenuation constant greater than 30 dB per centimeter at 300 megahertz formed on the surface of the piezoelectric means between the input transducer and an end edge of the piezoelectric means adjacent the input transducer, the acoustic energy absorbing area having a facing edge within a range of not greater than one micron of a predetermined distance from the back edge of the input transducer.

23. The SAW device according to claim 22 wherein the sound absorbent material is polyimide.

24. The SAW device according to claim 22 wherein the output transducer has a back edge, further comprising a second acoustic energy absorbing area consisting of sound absorbent material having a sound attenuation constant greater than 30 dB per centimeter at 300 megahertz formed on the surface of the piezoelectric means between the output transducer and a second end edge of the piezoelectric means adjacent the output transducer, the second acoustic energy absorbing area having a facing edge within a range of not greater than one micron of a predetermined distance from the back edge of the output transducer.

25. The SAW device according to claim 24 wherein the sound absorbent material is polyimide.

26. A multistrip coupler surface acoustic wave (SAW) device comprising:
    piezoelectric means having end and side edges, the piezoelectric coupling means having a piezoelectric coupling constant less than 0.002;
    an input transducer in contact with the piezoelectric means for launching acoustic surface waves along a propagation path on the piezoelectric means in response to input electrical signals, the input transducer having a front edge and a back edge;
    an output transducer in contact with the piezoelectric means so as to be both longitudinally and laterally spaced apart from the input transducer;
    at least one coupling strip formed on the piezoelectric means in the longitudinal space between the input transducer and the output transducer; and
    an absorber strip consisting of sound absorbent material having a sound attenuation constant greater than 30 dB per centimeter at 300 megahertz formed on the surface of the piezoelectric means and the at least one coupling strip in the lateral space between the input transducer and the output transducer, the absorber strip having an edge within a range of not greater than one micron of a predetermined distance from a line bisecting the front edge and the back edge of the input transducer.

27. The SAW device according to claim 26 wherein the sound absorbent material is polyimide.

28. The SAW device according to claim 26, further comprising an acoustic energy absorbing area consisting of sound absorbent material having a sound attenuation constant greater than 30 dB per centimeter at 300 megahertz formed on the surface of the piezoelectric means between the input transducer and an end edge of the piezoelectric means adjacent the input transducer, the acoustic energy absorbing area having a facing edge within a range of not greater than one micron of a predetermined distance from the back edge of the input transducer.

29. The SAW device according to claim 28 wherein the output transducer has a back edge, further comprising a second acoustic energy absorbing area consisting of sound absorbent material having a sound attenuation constant greater than 30 dB per centimeter at 300 megahertz formed on the surface of the piezoelectric means between the output transducer and a second end edge of the piezoelectric means adjacent the output transducer, the second acoustic energy absorbing area having a facing edge within a range of not greater than one micron of a predetermined distance from the back edge of the output transducer.

30. An acoustic energy absorbing area for a surface acoustic wave (SAW) device including piezoelectric means having end and side edges, the piezoelectric means having a piezoelectric coupling constant less than 0.002, an input transducer in contact with the piezoelectric means for launching acoustic surface waves along a propagation path on the piezoelectric means in response to input electrical signals, and an output transducer in contact with the piezoelectric means across the propagation path from the input transducer and responsive to surface waves generated by the input transducer for generating output electrical signals corresponding to the received surface waves, the acoustic energy absorbing area consisting of sound absorbent material having a sound attenuation constant greater than 30 dB per centimeter at 300 megahertz formed on the surface of the piezoelectric means between at least one of the transducers and an end edge of the piezoelectric means adjacent the at least one transducer, the at least one transducer having a back edge and the acoustic energy absorbing area having a facing edge within a range of not greater than one micron of a predetermined distance from the back edge of the at least one transducer.

31. The SAW device according to claim 30 wherein the sound absorbent material is polyimide.

* * * * *